United States Patent [19]

Marmonier

[11] Patent Number: 5,960,372
[45] Date of Patent: Sep. 28, 1999

[54] METHOD OF MONITORING ELECTRICAL WEAR ON SELECTOR SWITCH DISCONNECTORS IN A HIGH VOLTAGE STATION

[75] Inventor: Jean Marmonier, Aix les Bains, France

[73] Assignee: GEC Alstrom T & D SA, Paris, France

[21] Appl. No.: 08/837,916

[22] Filed: Apr. 11, 1997

[30] Foreign Application Priority Data

Apr. 12, 1996 [FR] France .................................. 96 04602

[51] Int. Cl.⁶ .................................................. H01H 33/00
[52] U.S. Cl. ................................ 702/57; 702/34; 702/65;
324/415; 324/422; 361/66; 200/1 R; 200/175
[58] Field of Search .................................. 702/34, 38, 57,
702/65; 324/415, 422, 424; 361/1, 62, 63,
64, 65, 66, 39; 200/1 R, 175, 43.01, 51 R

[56] References Cited

U.S. PATENT DOCUMENTS

| | | |
|---|---|---|
| 4,577,253 | 3/1986 | Blahous et al. .............................. 361/62 |
| 5,384,678 | 1/1995 | Ebersohl et al. ............................ 361/62 |
| 5,475,558 | 12/1995 | Barjonnet et al. .......................... 361/64 |
| 5,619,392 | 4/1997 | Bertsch et al. .............................. 361/65 |
| 5,648,917 | 7/1997 | Ebersohl et al. ..................... 364/514 C |
| 5,828,540 | 10/1998 | Marmonier et al. ...................... 361/195 |

FOREIGN PATENT DOCUMENTS

| | | |
|---|---|---|
| 0574300A1 | 2/1993 | European Pat. Off. . |
| 0665567A1 | 8/1995 | European Pat. Off. . |
| 3642108A1 | 6/1988 | Germany . |

*Primary Examiner*—Patrick Assouad
*Attorney, Agent, or Firm*—Sughrue, Mion, Zinn, Macpeak & Seas, PLLC

[57] ABSTRACT

The present invention relates to a method of monitoring electrical wear on selector switch disconnectors in a bay of a high voltage station that includes a set of distribution busbars connected to at least three electrical circuits constituted by an inlet bay, an outlet bay, and a bay for coupling together the busbars. During an operation of transferring a bay under load, when the computer of the corresponding bay detects that the disconnectors of its lines for connection to the distribution busbars are closed, the computer sends a message to the other computers which then determine and store data comprising the magnitude and the polarity of the current flowing through the corresponding bays, and when the computer of the bay in which transfer is taking place has detected opening of the selector switch disconnector in the line for connection to the busbar from which distribution has been transferred, said data prior to the opening is stored and the square of the current interrupted by said disconnector is calculated.

4 Claims, 5 Drawing Sheets

METHOD OF MONITORING ELECTRICAL WEAR ON SELECTOR SWITCH DISCONNECTORS IN A HIGH VOLTAGE STATION

FIELD OF THE INVENTION

The invention relates to a method of monitoring electrical wear on selector switch disconnectors in a high voltage station.

More precisely, the invention relates to a method of monitoring the electrical wear of selector switch disconnectors in a bay of a high voltage station that includes a set of distribution busbars connected to at least three electrical circuits constituted by an inlet bay, an outlet bay, and a coupling bay for coupling together the busbars, each bay including a respective connection line to each busbar fitted with a respective selector switch disconnector, and being associated with a bay computer capable of determining the magnitude and the polarity of the current flowing through the bay, and also the states of the selector switch disconnectors in the bay, with all of the computers of the station being interconnected by an information transfer line.

BACKGROUND OF THE INVENTION

In such a known station, one of the functions of the selector switch disconnectors and of the looping bay is to enable transfers to be made from one busbar to another under load, i.e. without interrupting distribution. When such a transfer is taking place under load, a selector switch disconnector must be opened while non-negligible current is passing through it. Unfortunately, during this operation, the disconnector is subjected to electrical wear which must be monitored.

It is known that the mechanical wear of such disconnectors can be monitored merely by counting the number of times each switch is operated. Nevertheless, that type of monitoring is unsatisfactory when numerous transfer operations are performed under load, and it turns out that the acceptable limit for electrical wear is reached before the maximum acceptable number of maneuvers is itself reached.

Also, for the purpose of protecting its circuit breakers, such a known station is fitted with a computer for each bay, which computers transfer state information to an operation monitoring station, such information including the positions of the disconnectors and of the circuit breakers included in the inlet and outlet bays, together with the values of the current in each bay.

OBJECTS AND SUMMARY OF THE INVENTION

The present invention consists in a method of monitoring the electrical wear of selector switch disconnectors, which wear has not been monitored until now, and which method requires no special additional equipment.

To achieve this, the method of the invention consists in performing the following processing:

when a bay is being transferred under load, once the corresponding bay computer detects that the disconnectors of the lines for connection to the distribution busbars are all closed, it sends a message to the other computers which then determine and record data comprising the magnitude and the polarity of the current flowing through the corresponding bays; and when the computer of the bay being transferred detects opening of the selector switch disconnector of the line for connection to the busbar whose distribution is being transferred, referred to as the "transferred" busbar, said data prior to opening is stored and the value of the square of the current interrupted by said disconnector is computed.

In a preferred implementation, said computer sends said message to the other computers via a higher level computer;

said data is transmitted to the higher level computer which deduces therefrom, by calculation, the value of the square of the current interrupted by said disconnector.

Preferably, the higher level computer transmits the value of the square of the current interrupted to the computer of the bay, which computer sums said values each time a transfer operation is performed under load and compares the sum with an acceptable limit value.

The current interrupted by said disconnector is computed by adding together the currents entering the transferred busbar and by subtracting therefrom the currents leaving the transferred busbar.

The invention makes it possible to determine accurately the current interrupted by the disconnector.

BRIEF DESCRIPTION OF THE DRAWINGS

The invention is described in greater detail with reference to the figures that show only a preferred embodiment of the invention.

MORE DETAILED DESCRIPTION

The various figures show a high voltage station comprising:

two distribution busbars B1 and B2;

an inlet bay T3 fitted with a circuit breaker D3 and including a line for connection to the first busbar B1 fitted with a selector switch disconnector S31 and a line for connection to the second bay B2 fitted with a selector switch disconnector S32;

two outlet bays T1 and T2 each fitted with its own circuit breaker D1, D2 and each including a respective line for connection to the first busbar B1 and fitted with a respective selector switch disconnector S11 or S21, and a line for connection to the second busbar B2 fitted with a respective selector switch disconnector S12 or S22; and a coupling bay T4 for interconnecting the two busbars B1 and B2 and fitted with two disconnectors S41 and S42.

Figure 1A:
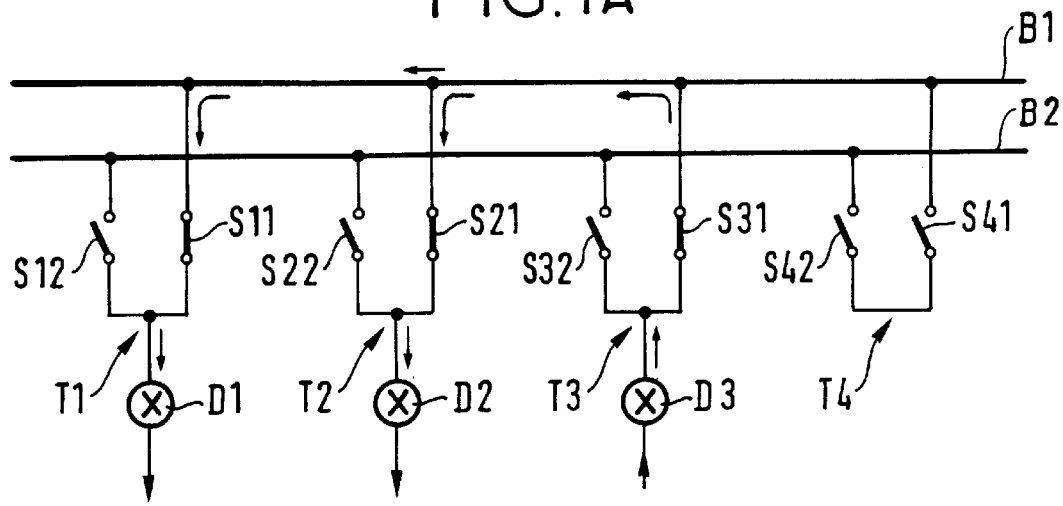
FIGS. 1A to 1C are diagrammatic views of a high voltage station and show the principle of performing a transfer under load.
Figure 1B:
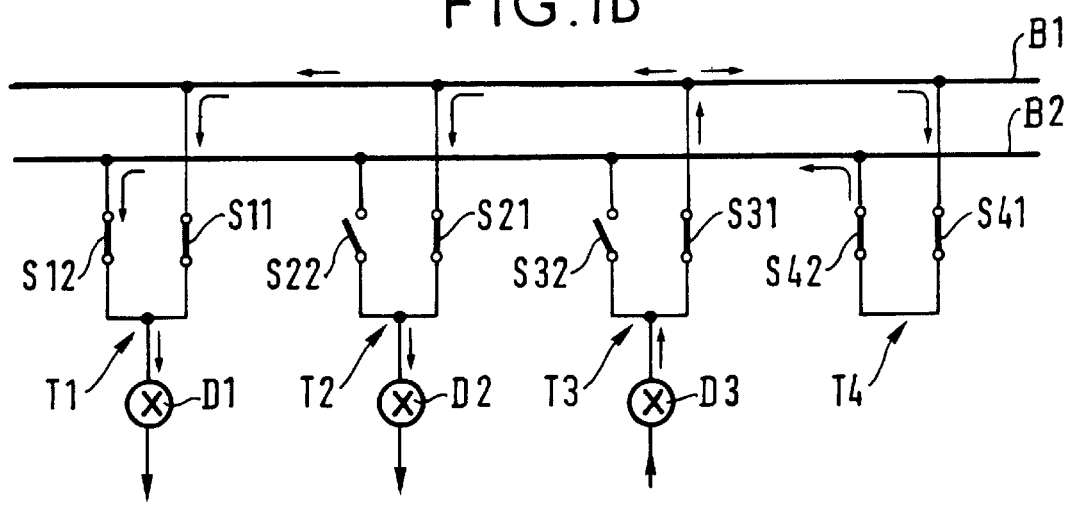
Figure 1C:
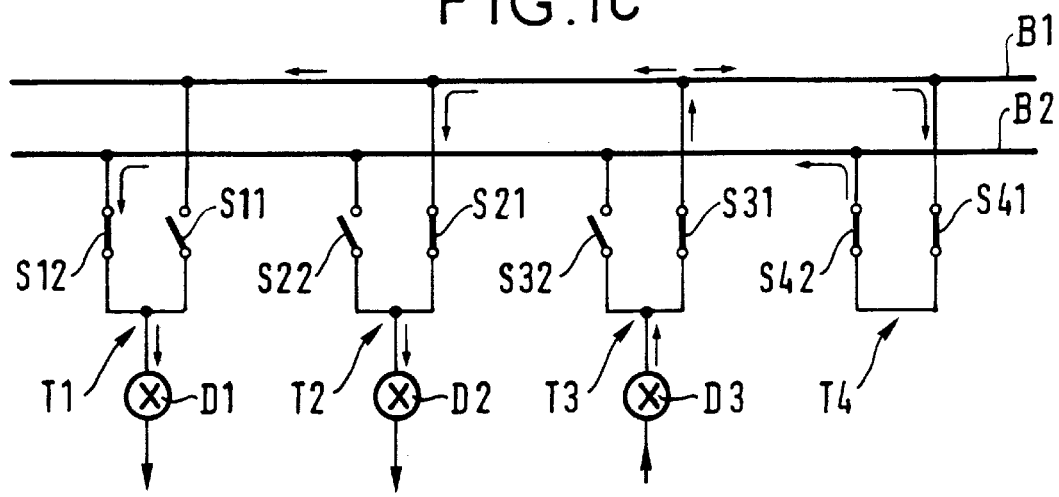

In FIGS. 1A to 1C, arrows represent currents.

FIG. 1A shows the station before a transfer under load is performed. The coupling bay is then inoperative, both its disconnectors S41 and S42 being open. The current arrives via the inlet bay T3 and is distributed by the first busbar B1 to the outlet bays T1 and T2. All of the selector switch disconnectors of the lines for connection to the first busbar B1 are thus closed, and all of the selector switch disconnectors in the lines for connection to the second busbar B2 are thus open.

In FIG. 1B, an operation of transfer under load of the bay T1 is taking place. The disconnectors S41 and S42 of the looping bay are initially closed and the selector switch disconnector S12 of the line connecting the second busbar B2 to the bay T1 is then closed. Current can then flow along the arrows shown, and the bay T1 then receives electrical current from both the first busbar B1 and from the second busbar B2.

Thereafter, the selector switch disconnector S11 in its connection line to the first busbar B1 is opened, as shown in FIG. 1C. The bay T1 then receives current from the second busbar B2 only, distribution having been transferred from the first busbar B1 to the second busbar B2 for the bay T1. The operation of performing a transfer under load for the bay T1 is thus completed.

FIGS. 2A to 2D show the same high voltage station together with its monitoring equipment.

In these figures, arrows represent the transfer of information.

Each bay is fitted with a respective bay computer C1 to C4 capable, amongst other things, of determining the magnitude and the polarity of the current passing through the bay by means of a respective current measuring device M1 to M4, and also capable of determining the open or closed state of the disconnectors in the bay.

All of the computers C1 to C4 are connected via a data transfer line L to a higher level computer CG that controls said computers C1 to C4. The computer CG is connected to an operator station 01, and in accordance with the invention it is advantageously connected to a second operator station 02 whose function is specified below.

Figure 2A:
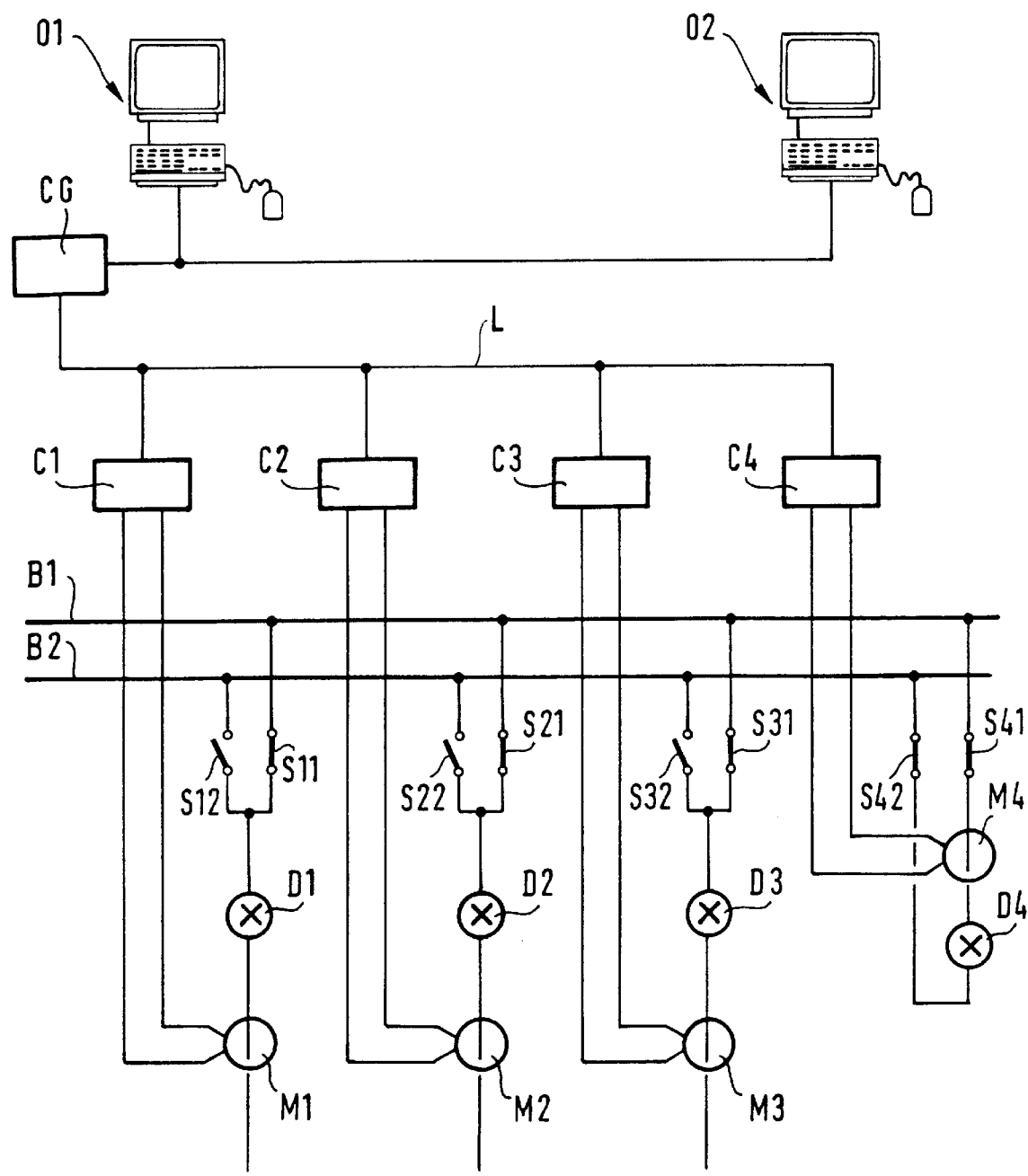
FIGS. 2A to 2D show a high voltage station with its monitoring equipment and they show how the method of the invention can be performed.

FIG. 2A shows the station prior to an operation of performing a transfer under load. No measurements specific to the method of the invention are performed, and no information is transmitted to the computers C1 to C4.

Figure 2B:
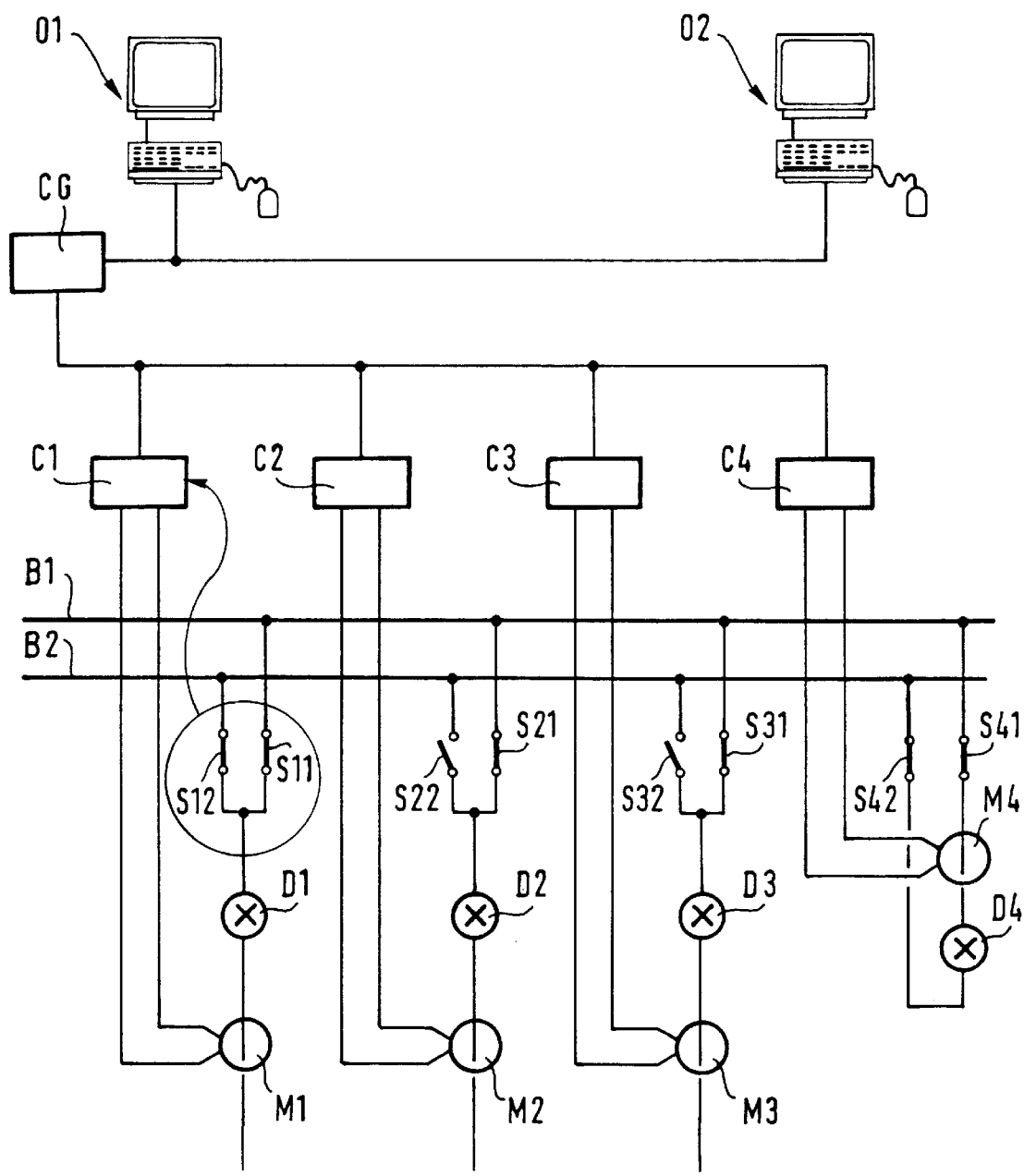

In FIG. 2B, the operation of performing a transfer under load has begun and the two selector switch disconnectors S11 and S12 are closed. This state is detected and conveyed to the computer C1 of the bay T1.

Figure 2C:
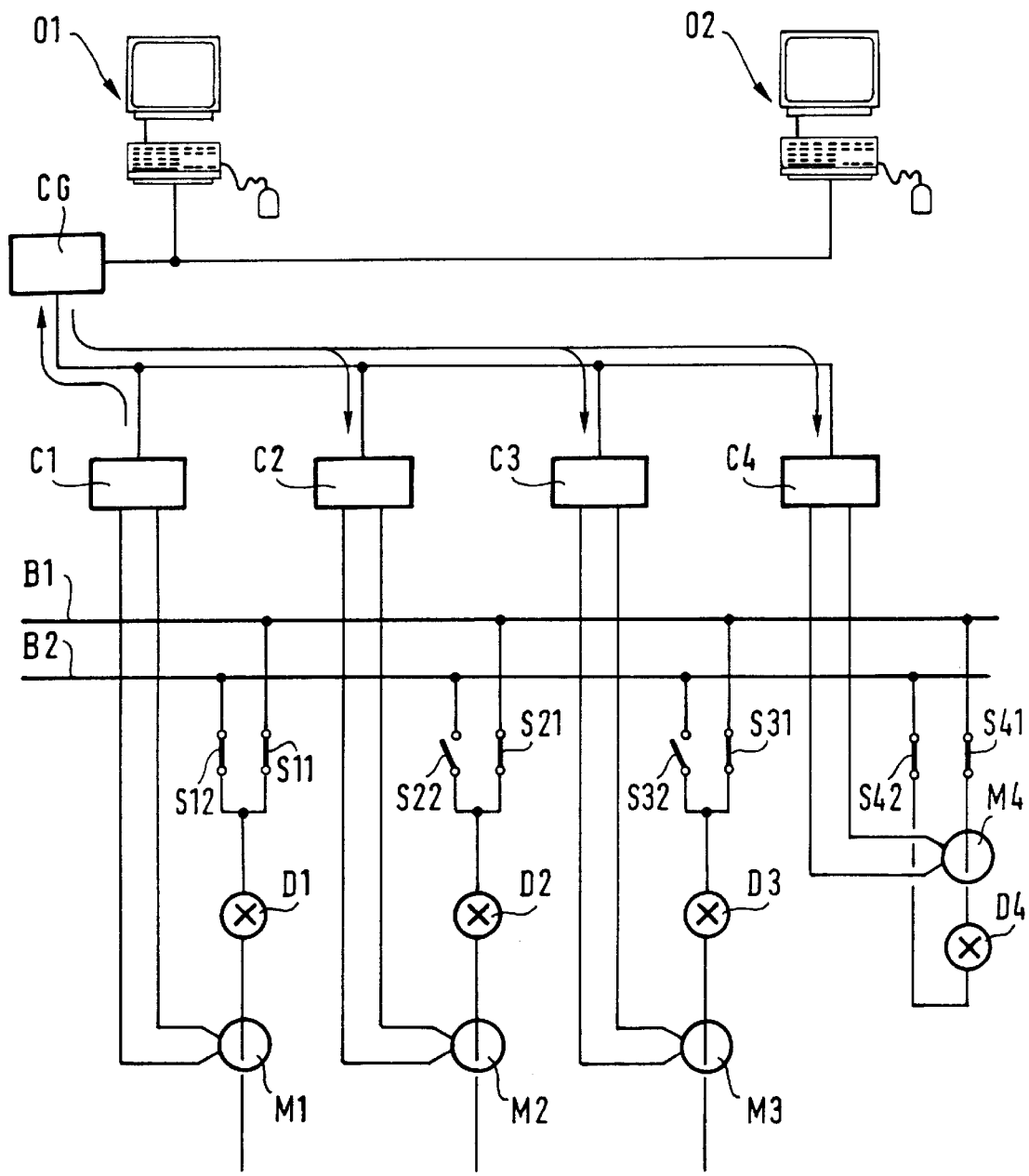

At this instant, as shown diagrammatically in FIG. 2C, the computer C1 sends a message via the higher level computer CG to the other computers C2 to C3 which then determine and record data comprising the magnitude and the polarity of the current flowing through their respective bays T2 to T3.

Figure 2D:
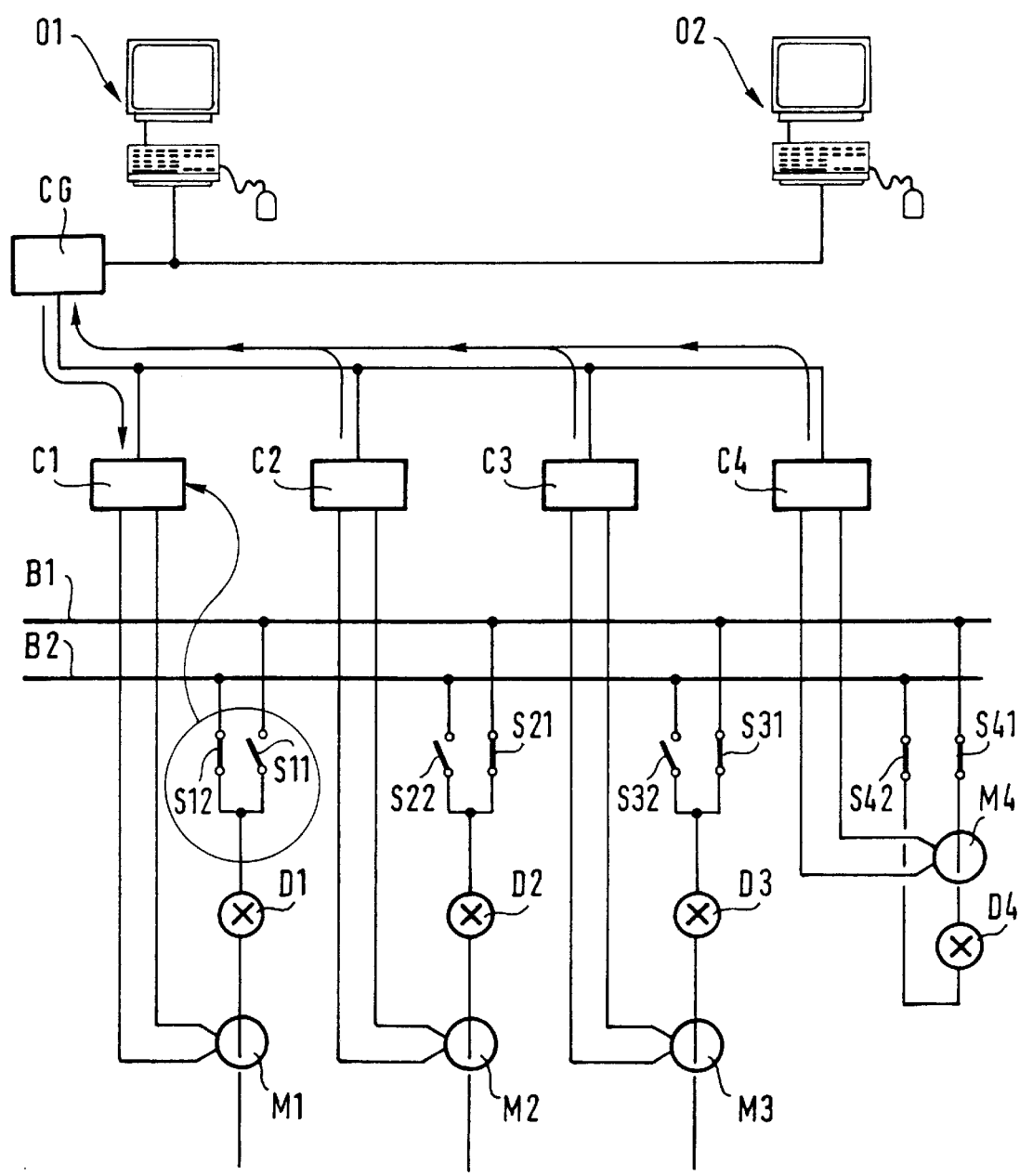

Once the computer C1 has detected opening of the selector switch disconnector S11 in the line for connection to the busbar B1 from which distribution is being transferred, referred to as the "transferred" busbar, and thus the end of the operation of performing a transfer under load, as shown in FIG. 2D, then said data from before the opening (corresponding to an instant t immediately before opening) is transmitted from computers C2-C3 to computer CG.

By calculation, the computer CG can then compute the magnitude of the current interrupted by the disconnector S11 by adding together the magnitudes of the currents entering the transferred busbar B1 and subtracting the values of the currents leaving the transferred busbar B1, with said calculation applying Kirchhoff's law concerning electrical nodes. By means of its conventional monitoring function, the computer CG knows which distribution busbar B1 or B2 is connected to each bay (information equivalent to the open or closed state of each selector switch disconnector in each bay and transmitted thereto by the computers C2 to C4).

The computer CG then computes the square of the current interrupted by said disconnector S11 which is representative of the electrical wear suffered by the disconnector S11 during said operation of performing a transfer under load.

This value is transmitted to the computer C1 which sums such values each time a transfer operation is performed under load and which compares the resulting sum with an acceptable limit value.

The operator station 02 can be used for displaying said monitoring of the electrical wear in each selector switch disconnector in a user-friendly way.

The method of the invention can be used without intervention of a higher level computer. Under such circumstances, said message from the computer C1 is transmitted directly to the other computers C2-C3, and said data is transmitted directly by the computers C2-C3 to the computer C1 which then itself calculates the square of the current interrupted by the disconnector S11.

I claim:

1. A method of monitoring the electrical wear of selector switch disconnectors in bays of a high voltage station that includes a set of distribution busbars connected to at least three electrical circuits constituted by an inlet bay, an outlet bay, and a coupling bay for coupling together the busbars, each bay has a respective connection line to each busbar fitted with a respective selector switch disconnector, and each bay is associated with a bay computer capable of determining a magnitude and a polarity of a current flowing through the associated bay, and said bay computers are also capable of determining states of the selector switch disconnectors in the associated bay, with all of the bay computers of the high voltage station being interconnected by an information transfer line, the method comprising the steps of:

when one of said bays is being transferred under load, detecting by the bay computer associated with said one of said bays whether the disconnectors are all closed, sending a message from the bay computer associated with said one of said bays to others of said bay computers not associated with said one of said bays, wherein said others of said bay computers determine and record data comprising the magnitude and the polarity of currents flowing through the bays;

detecting by the bay computer associated with said one of said bays an opening of the selector switch disconnector of said one of said bays for connection to the busbar whose distribution is being transferred, referred to as a transferred busbar, and storing said data and computing a value of a square of the current interrupted by said disconnector of said one of said bays.

2. A method according to claim 1, wherein:

said bay computer associated with said one of said bays sends said message to said others of said bay computers via a higher level computer; and said data is transmitted to the higher level computer which calculates the value of the square of the current interrupted by said disconnector of said one of said bays.

3. A method according to claim 2, wherein the higher level computer transmits the value of the square of the current interrupted to the computer associated with said one of said bays, where the computer associated with said one of said bays adds said value to a sum each time a transfer operation is performed under load and compares the sum with an acceptable limit value.

4. A method according to claim 1, wherein the current interrupted by said disconnector of said one of said bays is computed by adding together currents entering the transferred busbar and by subtracting therefrom currents leaving the transferred busbar.

* * * * *